(12) United States Patent
Fischer et al.

(10) Patent No.: US 6,787,801 B2
(45) Date of Patent: Sep. 7, 2004

(54) WAFER WITH ADDITIONAL CIRCUIT PARTS IN THE KERF AREA FOR TESTING INTEGRATED CIRCUITS ON THE WAFER

(75) Inventors: Helmut Fischer, Oberhaching (DE); Alan Morgan, München (DE)

(73) Assignee: Infienon Technologies AG, Munich (DE)

( * ) Notice: Subject to any disclaimer, the term of this patent is extended or adjusted under 35 U.S.C. 154(b) by 0 days.

(21) Appl. No.: 10/247,574

(22) Filed: Sep. 19, 2002

(65) Prior Publication Data

US 2003/0067002 A1 Apr. 10, 2003

(30) Foreign Application Priority Data

Sep. 19, 2001 (DE) ............................................. 101 46 177

(51) Int. Cl.⁷ ........................ H01L 23/58; G01R 31/26
(52) U.S. Cl. ........................ 257/48; 257/203; 257/207; 257/208; 324/500; 324/537; 324/765
(58) Field of Search ........................ 257/48, 203, 207, 257/208; 324/500, 537, 765

(56) References Cited

U.S. PATENT DOCUMENTS

| | | | | |
|---|---|---|---|---|
| 3,781,683 A | * | 12/1973 | Freed .......................... | 324/765 |
| 4,970,454 A | * | 11/1990 | Stambaugh et al. ........ | 324/73.1 |
| 5,059,899 A | | 10/1991 | Farnworth et al. | |
| 5,808,947 A | * | 9/1998 | McClure ..................... | 365/201 |
| 5,899,703 A | | 5/1999 | Kalter et al. | |
| 5,929,650 A | | 7/1999 | Pappert et al. | |
| 5,946,248 A | | 8/1999 | Chien et al. | |
| 6,008,664 A | * | 12/1999 | Jett et al. ..................... | 324/765 |
| 6,236,224 B1 | * | 5/2001 | Schneider ................... | 324/765 |
| 6,399,400 B1 | * | 6/2002 | Osann et al. ................. | 438/14 |

FOREIGN PATENT DOCUMENTS

| | | |
|---|---|---|
| DE | 197 07 312 A1 | 8/1998 |
| DE | 198 31 563 C2 | 2/2000 |

OTHER PUBLICATIONS

Wojciech Maly et al.: "Built–in Current Tasting", *IEEE Journal of Solid–State Circuits*, vol. 27, No. 3, Mar. 1992, pp. 425–428.

* cited by examiner

Primary Examiner—Nathan J. Flynn
Assistant Examiner—Johannes Mondt
(74) Attorney, Agent, or Firm—Laurence A. Greenberg; Werner H. Stemer; Ralph E. Locher

(57) ABSTRACT

Integrated circuits are tested on the wafer level through an additional circuit part that is electrically connected via at least one connecting line with the associated integrated circuit. The additional circuit part is integrated into an interspace between the integrated circuits of the wafer. Functions of the integrated circuit can be controlled via the connecting line. For example, in the case of a memory module such as a DRAM, internal voltages and/or currents of the integrated circuit can advantageously be measured even on internal lines which are otherwise only accessible with difficulty. Following the wafer-level testing and dicing of the integrated circuits into individual chips, the additional circuit part becomes unusable.

7 Claims, 1 Drawing Sheet

WAFER WITH ADDITIONAL CIRCUIT PARTS IN THE KERF AREA FOR TESTING INTEGRATED CIRCUITS ON THE WAFER

BACKGROUND OF THE INVENTION

Field of the Invention

The invention relates to a wafer with a plurality of integrated circuits, which are arranged in rows and columns in such a way that interspaces result. The individual integrated circuits can be separated from one another in the area of the interspaces after being tested with an external test system. Additional circuit parts are integrated into the interspaces, each formed with at least one connecting line with an associated integrated circuit via which a function of the integrated circuit can be controlled, and on each of which at least one contact land is provided with which a connection to the external test system can be made.

Current integrated circuits can be constructed very complexly and comprehensively, so that intermediate measurements to check functions or parameters can be complicated and very difficult. In particular at the wafer stage, when the integrated circuits arranged in rows and columns have not yet been separated, i.e., the wafer has not yet been diced, making contact by using a so-called needle card for testing the integrated circuit is possible only to a limited extent, since access to specific circuit parts is often very difficult because of the compact geometries and the close conductor track spacings.

That problem occurs, for example, in the case of memory circuits such as DRAMs (Dynamic Random Access Memory) or similar circuits. There, inter alia, the memory cells have to be checked for example for short circuits or interruptions, the current consumption, internal voltage generators and so on. In particular, testing the current consumption is very difficult, since the conductor tracks of the integrated circuit (IC) cannot be interrupted briefly for a direct current measurement.

The integrated circuit generally also has many control functions. The appropriate test modes, therefore, have to be generated accordingly by the external test system and have to be sent to the integrated circuit at the correct timing cycle rate.

In order to solve the problems, hitherto, for example, specific monitor pads, as they are known, were integrated onto the chip and can be activated or deactivated by means of an appropriate test mode. These monitor pads have an internal chip connection to the integrated circuit and permit, inter alia, a voltage to be fed in, which is supplied by a test system for the desired test function. Making contact with the monitor pads is carried out via a needle card which is matched to the integrated circuit, so that all the necessary voltages, currents or else data words can be transmitted to the integrated circuit or read out from the latter via its contact needles. In some cases, the contact needles also have to be placed directly on the very narrow conductor tracks in order to be able to carry out the desired tests.

Apart from the fact that the sensitive conductor tracks can be damaged, measurement errors may also be included, since the ground level can also be raised by impressing a current or voltage, and voltage drops can occur along the contacts.

Added to this is the fact that, for example in the case of one or more short circuits on a wafer, the current loading can rise enormously, so that this test is made more difficult, since the contact needles and even the conductor tracks are able to cope with only a specific maximum current without being damaged.

Furthermore, it is disadvantageous that, in such a case, the wafer may be heated up to a great extent locally which, depending on the circuit part, can lead to undesired thermal effects such as mechanical stresses, piezoelectric effects and so on, with corresponding erroneous behavior.

The practice of integrating test circuits into the interspace between two chips, the so-called kerf, has also been disclosed. These test circuits have appropriate measuring or contact lands, with which contact can likewise be made by special measuring devices, so that the test system can likewise use these auxiliary circuits for testing the integrated circuits.

A wafer forming the genus of this disclosure is found in U.S. Pat. No. 5,929,650. There, the wafer has a plurality of integrated circuits arranged in rows and columns in such a way that interspaces result. The individual integrated circuits can be separated from one another by dicing along the interspaces (i.e., kerfs) after being tested with an external test system. In the case of the prior art wafer, an additional circuit part is provided in the kerf area for the functional control of the integrated circuits in the individual wafer chips for the purpose of testing. Each of the additional circuit parts comprise at least one connecting line with an associated integrated circuit via which a function of the integrated circuit can be controlled, and on each of which at least one contact land is provided with which a connection to the external test system can be made.

U.S. Pat. No. 5,059,899 also discloses a wafer having a voltage-blocking circuit which is used for the purpose of preventing short circuits arising from the cut-up test conductor tracks after the wafer has been cut up into individual chips. Furthermore, a wafer with an intermediate driver in the kerf area is presented in U.S. Pat. No. 5,899,703.

SUMMARY OF THE INVENTION

It is accordingly an object of the invention to provide a wafer with additional circuit parts in the kerf are for testing integrated circuits on the wafer, which overcomes the above-mentioned disadvantages of the heretofore-known devices and methods of this general type and which, in simple terms, provides an improved wafer design for testing integrated circuits on the wafer.

With the foregoing and other objects in view there is provided, in accordance with the invention, a wafer, comprising:

a plurality of integrated circuits arranged in rows and columns and forming interspaces therebetween, along which the individual integrated circuits are separated from one another after testing with an external test system;

additional circuit parts integrated in the interspaces;

at least one connecting line connecting each of the additional circuit parts with a respectively associated one of the integrated circuits for controlling a function of the integrated circuit;

at least one contact land formed on each the additional circuit part for connecting the additional circuit part with an external test system;

each the additional circuit part having an intermediate driver configured to disconnect a voltage supplied from the external test system via the additional circuit part to the associated the integrated circuit from an internal voltage of the integrated circuit.

In other words, in the wafer design according to the invention, additional circuit parts, which are formed in the kerf area, are used for testing the integrated circuits on the wafer, it being possible, via at least one connecting line, for functions of an associated integrated circuit to be controlled, such as the activation or deactivation of a voltage generator or the like. In this case, the additional circuit part comprises an intermediate driver, with which disconnection of the voltage supplied by the test system from an internal voltage of the integrated circuit is achieved. As a result, an internal generator can be switched off and a test voltage can be applied externally to a location envisaged on the integrated circuit. In this way, important functions such as the functional capability, the current and voltage behavior, short circuits and so on may advantageously be assessed.

In accordance with an added feature of the invention, the additional circuit part has a measuring device with which a specific voltage of the integrated circuit can be measured directly. Voltage drops, caused by long lines to the test system or high contact resistances at the contact lands, are effectively avoided.

In accordance with an additional feature of the invention, the system is configured for a current measurement, which can likewise be carried out with an appropriate measuring device of the additional circuit part. As a result, for example, it is easily possible to assess whether a specific circuit part of the integrated circuit is fulfilling the desired function, as an interruption or a short circuit or causes another fault.

In accordance with another feature of the invention, the additional circuit part has a converter with which, for example, a digital data word corresponding to the measurement is generated and sent to the test system. The transmission of digital data words, in particular over long lines, is generally less susceptible to faults than the transmission of an analog value.

By means of appropriate contact lands on the additional circuit part, a connection to the test system can easily be made, so that measured values, data words or test configurations can easily be exchanged between the additional circuit part and the test system.

A particularly beneficial solution is also seen if the additional circuit part sends a signal to the test system in the event of a short circuit being found. As a result, protective measures against excessively high current loadings of the test system can be taken in a straightforward way, and faulty chips can also be marked simply.

The application of the wafer design according to the invention, for example in a memory circuit such as a DRAM, yields the advantage that, by activating or deactivating the internal generators, individual circuit parts can easily be checked. This can be done, for example, in a generator off mode, as it is known, in which the internal chip generators are temporarily deactivated in order to be able to feed in an external voltage or an external current.

Other features which are considered as characteristic for the invention are set forth in the appended claims.

Although the invention is illustrated and described herein as embodied in a wafer with additional circuit parts in the kerf area for testing integrated circuits on the wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
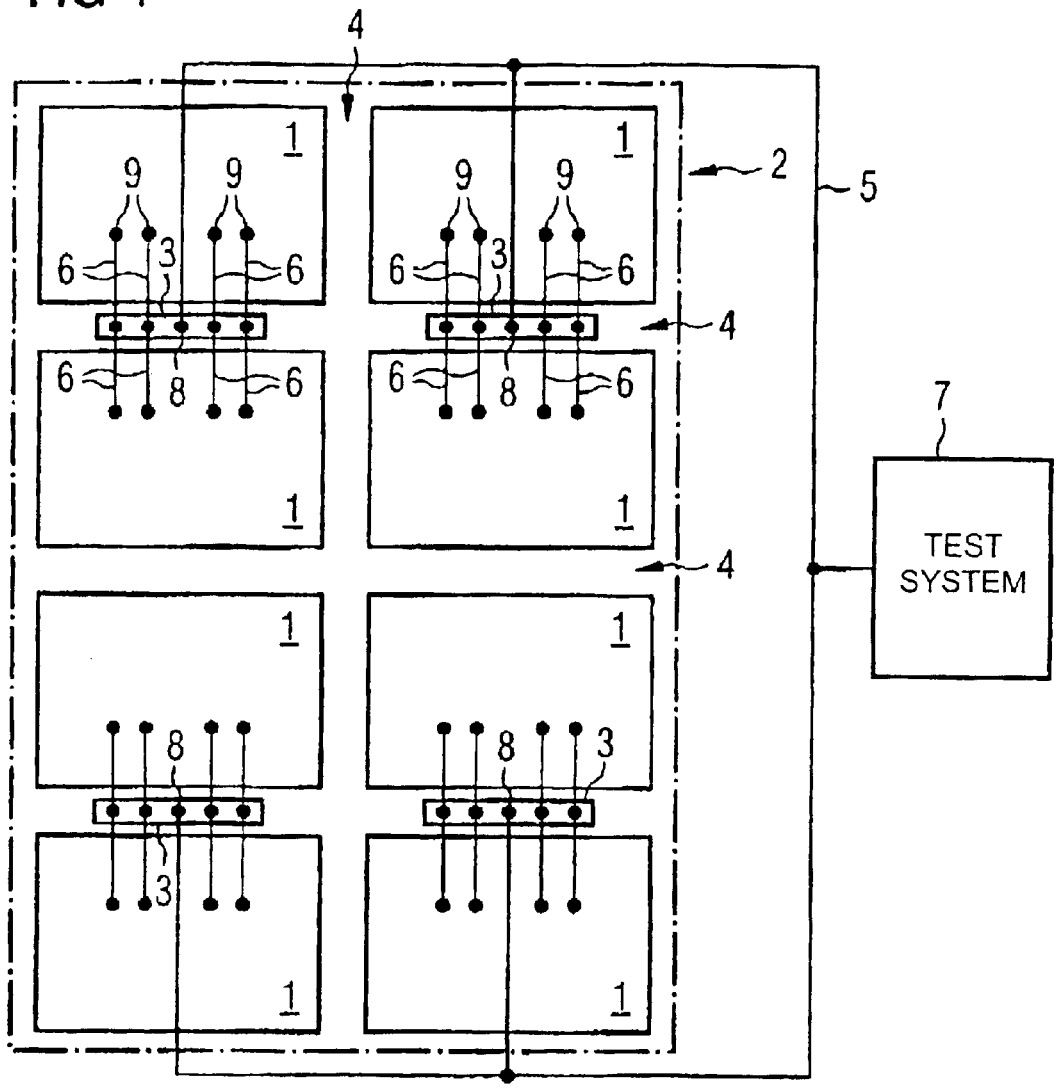
FIG. 1 is a block schematic of a detail of a wafer with additional circuit parts provided in the interspaces.

Referring now to the figures of the drawing in detail and first, particularly, to FIG. 1 thereof, there is shown a schematic illustration of a detail from a wafer 2 (semiconductor wafer), in which integrated circuits 1 are arranged in rows and columns. In FIG. 1, as a detail, eight integrated circuits 1, which are generally also designated chips, are arranged in four rows and two columns. Between two adjacent integrated circuits 1, an interspace 4 is provided in each case, at which the individual chips are subsequently separated, for example by sawing, during the dicing operation. The interspace 4 is also referred to as a kerf and contains at least one additional circuit part 3, which can be designed in particular for measurement purposes but also for adjustment and balancing tasks.

In a preferred exemplary embodiment of the invention, provision is made for the integrated circuits 1 to be implemented as memory modules. These can be DRAM chips or the like. In the case of the memory modules, the problem arises that very many memory cells are arranged in a very small space, and therefore the testing of these individual memory cells is very time-consuming and therefore costly.

According to the invention, therefore, an intermediate driver is proposed as an additional circuit part 3, with which one or more functions of the integrated circuit 1 can now be controlled. For example, via the additional circuit part 3, an internal generator of the integrated circuit 1 can be replaced. For this test, the generator integrated on the chip has to be switched off.

The additional circuit part is connected directly to the integrated circuit 1 via connecting lines 6 at locations that are provided. These connecting lines 6 lead to appropriate connecting lands 9 on the integrated circuit 1. Furthermore, contact lands 8 are provided on the additional circuit part 3, on which lands an associated contact needle can be placed by means of an appropriately designed needle card. This contact needle is connected to an external test system 7 via a test system connection 5. In this way, the test system 7 can, for example, feed currents, voltages or data words directly to the additional circuit part or else interrogate them from the latter.

It will be understood by those of skill in the pertinent art that appropriately designed contact and measuring lands are also provided on the individual integrated circuits 1, on which corresponding needles of the needle card can be placed for the measurement or control of the integrated circuit 3. These contact and measuring lands and the needle card having the individual contact needles are not illustrated for reasons of clarity.

The design of the additional circuit part 3 can be configured as desired and depends substantially on the task to be solved and the available space in the kerf 4. For example, the additional circuit part 3 can contain, for example, driver stages, operational amplifiers, measuring circuits, decoders, converters for converting digital data or analog measured values, protective circuits and so on. In addition, representative signals for a short circuit or an interruption to individual memory cells of the integrated circuit 1 can be sent to the external test system 7.

Figure 2:
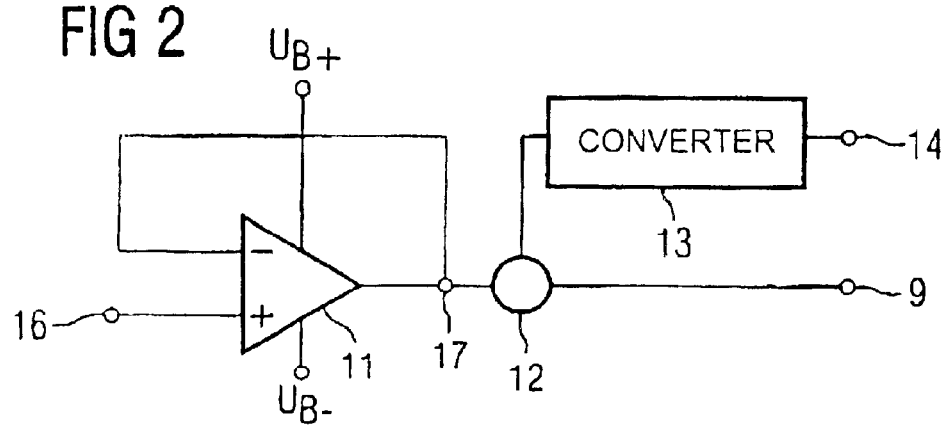
FIG. 2 is a circuit diagram exemplifying an additional circuit part according to the invention.

FIG. 2 shows a circuit diagram of an additional circuit part 3 in a schematic illustration, and by way of an exemplary embodiment. There is shown an operational amplifier 11 which is connected as a voltage follower. The operational amplifier 11 is fed by the necessary voltage UB+, UB−. Its input 16 is, for example, connected to the contact land 8 according to FIG. 1, so that the external test system 7 can feed in a desired test voltage via the test system connection 5. In the simplest case, an output 17 of the voltage follower 11 is connected to the integrated circuit 1, so that for example the generator voltage can be deactivated in the generator off mode and can be fed in via the additional circuit part 3. For this purpose, the generator of the integrated circuit 1 is deactivated by the test configuration of the test system via contact lands, not illustrated.

Then, if it is intended for example to measure the current consumption of a corresponding area of the integrated circuit 1, then—as further illustrated in FIG. 2—a measuring device 12 for current measurement can be connected downstream of the voltage follower 11. This measuring device 12 is connected between the output 17 of the voltage follower 11 and one of the connecting lands 9 (FIG. 1). In this way, the current flowing in the integrated circuit 1 can be measured in a simple way.

In an alternative refinement of the invention, provision is also made for the measuring device 12 to be implemented as a voltage meter, so that the voltage across the associated location of the integrated circuit 1 can be registered.

The method described above of registering current values, voltage values, interruptions and short circuits can be output directly to the external test system 7, for example via an output land 14. In a further alternative refinement of the invention, provision is also made for a converter 13 to be connected between the output of the measuring device 12 and the output land 14. The converter 13 can, for example, digitize the measured values from the measuring device 12 and convert them into corresponding digital data words, which are then transmitted to the external test system 7 via the test system connection 5.

Of course, given appropriate configuration of the converter 13 and the additional circuit part 3, digital data words from the external test system 7 can also be converted into corresponding control commands for the integrated circuit 1.

The additional circuit part 3 is rendered unusable by the separation of the integrated circuits, i.e., when the wafer is diced along the kerf lines.

We claim:

1. A wafer, comprising:
    a plurality of integrated circuits arranged in rows and columns and forming interspaces therebetween, along which said individual integrated circuits are separated from one another after testing with an external test system;
    additional circuit parts integrated in said interspaces;
    each of said additional circuit parts being connected with a respectively associated one of said integrated circuits by at least one connecting line for controlling a function of said integrated circuit;
    at least one contact land formed on each of said additional circuit parts for connecting said each of said additional circuit parts with an external test system;
    each of said additional circuit parts having an intermediate driver configured to disconnect a voltage supplied from the external test system via said each of said additional circuit parts to said associated one of said integrated circuits from an internal voltage of said integrated circuits.

2. The wafer according to claim 1, wherein said intermediate driver is an operational amplifier connected as a voltage follower.

3. The wafer according to claim 1, wherein said additional circuit parts are configured to output a signal to the external test system if a short circuit exists on said integrated circuits.

4. The wafer according to claim 1, wherein said additional circuit parts include a measuring device for measuring a voltage present in said integrated circuits.

5. The wafer according to claim 4, wherein said additional circuit parts include a converter connected downstream of said measuring device in a signal flow direction, for digitizing measured values of said measuring device and for transmitting digitized measured values via a connection to the external test system.

6. The wafer according to claim 1, wherein said additional circuit parts include a measuring device for measuring a current flowing in said integrated circuits.

7. The wafer according to claim 6, wherein said additional circuit parts include a converter connected downstream of said measuring device in a signal flow direction, for digitizing measured values of said measuring device and for transmitting digitized measured values via a connection to the external test system.

* * * * *